(12) United States Patent
Kim

(10) Patent No.: US 8,349,665 B2
(45) Date of Patent: Jan. 8, 2013

(54) FUSE DEVICES AND METHODS OF OPERATING THE SAME

(75) Inventor: Deok-kee Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 33 days.

(21) Appl. No.: 12/929,205

(22) Filed: Jan. 7, 2011

(65) Prior Publication Data
US 2011/0102067 A1 May 5, 2011

Related U.S. Application Data

(62) Division of application No. 12/285,914, filed on Oct. 16, 2008, now Pat. No. 7,894,233.

(30) Foreign Application Priority Data

Mar. 11, 2008 (KR) .................... 10-2008-0022608

(51) Int. Cl.
*H01H 37/76* (2006.01)

(52) U.S. Cl. .......... 438/132; 438/281; 438/601; 365/96; 365/225.7; 327/525

(58) Field of Classification Search .................. 257/529, 257/355, 209, 530, E23.149, E23.147, E21.147, 257/E29.255, E21.409; 438/132, 601, 281; 365/96, 225.7

See application file for complete search history.

(56) References Cited

U.S. PATENT DOCUMENTS

2008/0277756 A1  11/2008  Min et al.

OTHER PUBLICATIONS

U.S. Office Action dated Mar. 25, 2010.
U.S. Office Action dated Jul. 19, 2010.

*Primary Examiner* — Benjamin Sandvik
*Assistant Examiner* — Whitney T Moore
(74) *Attorney, Agent, or Firm* — Harness, Dickey & Pierce, P.L.C.

(57) ABSTRACT

A fuse device includes a fuse unit, which includes a cathode, an anode, and a fuse link coupling the cathode and the anode. A transistor includes at least a portion of the fuse unit to be used as an element of the transistor.

16 Claims, 19 Drawing Sheets

ANNEALING

+
ANNEALING

FUSE DEVICES AND METHODS OF OPERATING THE SAME

PRIORITY STATEMENT

This application is a divisional of and claims priority under 35 U.S.C. §120/121 on application Ser. No. 12/285,914, filed on Oct. 16, 2008 now U.S. Pat. No. 7,894,233, which claims priority under 35 U.S.C. §119 to Korean Patent Application No. 10-2008-0022608, filed on Mar. 11, 2008, in the Korean Intellectual Property Office, the entire contents of each of which are incorporated herein by reference.

BACKGROUND

A conventional fuse device may be used in semiconductor memory devices or logic devices for various purposes, such as repairing defective cells, chip identification (ID) information, circuit customization, etc. For example, cells determined as defective can be replaced with redundancy cells by a fuse device. Accordingly, a decrease in a manufacturing yield due to the defective cells can be resolved.

Two types of fuse devices are a laser-blown type and an electrically-blown type. The laser-blown type fuse device may use a laser beam to blow a fuse line.

On the other hand, the electrically-blown type fuse device may apply a programming current to a fuse link so that the fuse link is blown due to an electromigration (EM) effect and a Joule heating effect. The method of electrically blowing a fuse can be used after packaging a semiconductor chip. A fuse device employing the method of electrically blowing a fuse may be referred to as an electrical fuse device.

A conventional electrical fuse device may have a change in electrical resistance caused by blowing the fuse link. However, according to the conventional method, a sufficient sensing margin cannot be obtained, and thus it may be difficult to reduce the sizes of a fuse device and a semiconductor device including the fuse device.

SUMMARY

Example embodiments relate to fuse devices and methods of operating and manufacturing the same. Fuse devices according to example embodiments may include a fuse link.

Example embodiments provide a fuse device which may include a fuse unit having a cathode, an anode, and a fuse link coupling the cathode and the anode, and a transistor in which at least a portion of the fuse unit may be used as an element of the transistor.

According to at least some example embodiments, the transistor may include a source and a drain disposed on a substrate at each of two sides of the fuse link, and the transistor may use the fuse link as a gate. At least one of the source and the drain may have a fuse structure including two regions located apart from each other, and a link region which may have a width less than each of the two regions and may be located between the two regions.

Example embodiments provide that the transistor may use the fuse unit as a source. The transistor may further include a drain located apart from the source and a gate disposed on a substrate between the source and the drain.

According to another example embodiment, the transistor may use the fuse unit as a drain. Furthermore, the transistor may include a source located apart from the drain and a gate disposed on a substrate between the source and the drain.

In accordance with at least some example embodiments, the fuse link may include a conductive layer and a highly-resistant region in a portion of the conductive layer, wherein the highly-resistant region may be a region having an electrical resistance higher than that of a remaining portion of the conductive layer. The highly-resistant region may be closer to the cathode than to the anode. The highly-resistant region may be a silicon region, and the remaining portion of the conductive layer may be a silicide region. The conductive layer may be a metal layer, and the highly-resistant region may be a doped region.

In accordance with another example embodiment, a transistor may use a fuse link as a gate and at least one of a source and a drain includes a fuse structure. A link region in the source and the drain may include a highly-resistant region.

Another example embodiment provides a method of operating a fuse device including a fuse unit, which includes a cathode, an anode, a fuse unit, and a fuse link coupling the cathode and the anode, and a transistor in which at least a portion of the fuse is used as an element of the transistor. The method may include applying a programming current to the fuse unit and measuring a drain current of the transistor.

According to another example embodiment, a transistor may include a source and a drain disposed on a substrate at each of two sides of the fuse link, and the transistor may use the fuse link as a gate. A gate voltage may be supplied to the cathode or the anode and a voltage may be supplied between the source and the drain to measure the drain current.

In at least one example embodiment wherein the transistor uses the fuse link as a gate, at least one of the source and the drain may include a fuse structure including two regions located apart from each other and a link region which has a width less than that of each of the two regions and is located between the two regions. The method may further include applying another programming current to at least one of the source and the drain having the fuse structure, prior to measuring the drain current.

According to some example embodiments, a transistor may use the fuse unit as a source and may include a drain located apart from the source and a gate disposed on a substrate between the source and the drain. A gate voltage may be supplied to the gate and a voltage may be supplied between the cathode and the drain to measure the drain current.

At least another example embodiment provides that a transistor may use the fuse unit as a drain and may include a source located apart from the drain and a gate disposed on a substrate between the source and the drain. A gate voltage may be supplied to the gate and a voltage may be supplied between the cathode and the source to measure the drain current.

According to at least some example embodiments, a portion of the fuse link may be blown due to a programming current. If the transistor uses the fuse link as a gate and at least one of the source and the drain has the fuse structure, the link regions of the source and/or the drain may be blown by another programming current.

At least some example embodiments provide that, a fuse link may include a conductive layer and a highly-resistant region in a portion of the conductive layer, wherein the highly-resistant region is a region having an electrical resistance higher than that of a remaining portion of the conductive layer. The highly-resistant region may move into the cathode due to a programming current.

In accordance with another example embodiment, a transistor may use the fuse link as a gate and at least one of the source and the drain has the fuse structure. The link region in the source and the drain may include another highly-resistant region. The other highly-resistant region may be moved out of the link region due to the other programming current.

BRIEF DESCRIPTION OF THE DRAWINGS

Example embodiments will be more clearly understood from the following detailed description taken in conjunction with the accompanying drawings, in which.

DETAILED DESCRIPTION

Figure 1A:
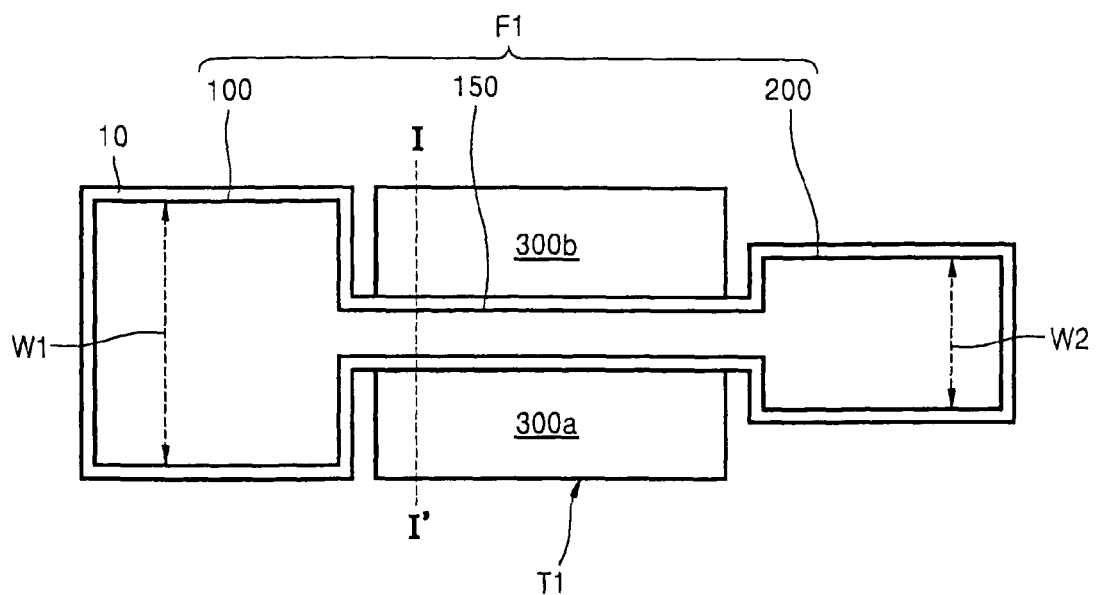
FIG. 1A is a plan view of a fuse device according to an example embodiment before the fuse device may be programmed.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

The terminology used herein is for the purpose of describing particular embodiments only and is not intended to be limiting of example embodiments of the invention.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Fuse devices and methods of operating and manufacturing the same according to example embodiments will now be described more fully with reference to the accompanying drawings.

Figure 1B:
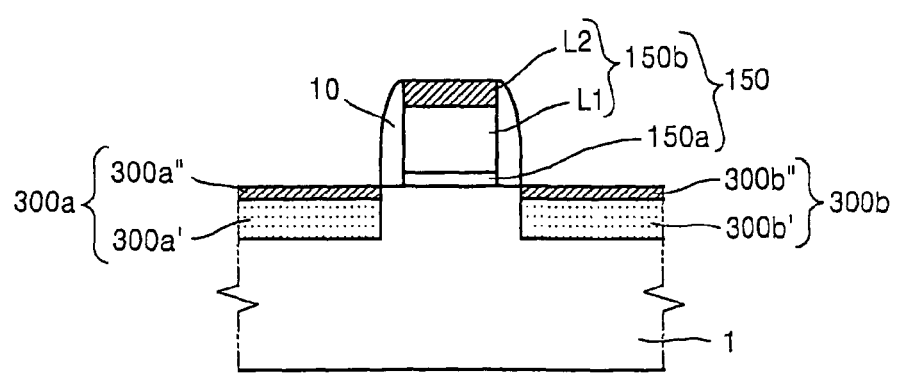
FIG. 1B is a cross-sectional view obtained along a line I-I' of FIG. 1A.

FIG. 1A is a plan view of a fuse device according to an example embodiment before the fuse device may be programmed, and FIG. 1B is a cross-sectional view of the fuse device obtained along a line I-I' of FIG. 1A.

Referring to FIG. 1A, the electrical fuse device may include a cathode 100 and an anode 200 that are located apart from each other, and a fuse link 150 that is disposed between the cathode 100 and the anode 200 so as to link the cathode 100 and the anode 200. The cathode 100, the anode 200, and the fuse link 150 may form a fuse unit F1, and a sidewall insulation layer 10 covering sidewalls of the fuse unit F1 may further be provided. Shapes of the cathode 100 and the anode 200 may be rectangles, and a width W1 of the cathode 100 may be larger than a width W2 of the anode 200. The shapes of the cathode 100 and the anode 200 can vary, and their sizes and size ratio can also vary. The fuse link 150 may have a width significantly smaller than that of the cathode 100 and the anode 200. For example, the fuse link 150 may have a width between dozens of nanometers (nm) to hundreds of nm and a length between dozens of nm and several micrometers (μm). When a current exceeding a critical point flows through the fuse link 150, a particular region of the fuse link 150 may be blown due to an electromigration (EM) effect and a Joule heating effect. As the width of the fuse link 150 decreases and the length of the fuse link 150 increases, the fuse link 150 can be blown more easily.

First and second conductive regions 300a and 300b may be disposed at each of two sides of the fuse link 150, respectively. One of the first and second conductive regions 300a and 300b may be a source, and the other may be a drain. The fuse link 150 between the first and second conductive regions 300a and 300b may be a gate. In other words, the fuse link 150 and the first and second conductive regions 300a and 300b may form a switching device such as a transistor T1.

Referring to FIG. 1B, the fuse link 150 may include an insulation layer 150a and a conductive layer 150b, which are formed on a substrate 1 in sequence, and the conductive layer 150b may have a multi-layer structure. The insulation layer 150a and the conductive layer 150b may be referred to as a gate insulation layer and a gate conductive layer, respectively. The conductive layer 150b may be a stacked layer structure including a lower layer L1 and an upper layer L2 disposed on the lower layer L1. Although the lower layer L1 may be a poly-silicon layer and the upper layer L2 may be a silicide layer, the example embodiments are not limited thereto, and thus, the structure and material of the conductive layer 150b may vary. For example, the conductive layer 150b may have either a single metal layer structure or a multi-metal layer structure. If the conductive layer 150b has a bi-metal layer structure, the lower layer L1 may be formed of one of Ti, TiN, and TaN, for example, and the upper layer L2 may be formed of one of W, Al, and Cu, for example. The list is not exhaustive. The cathode 100 and the anode 200, shown in FIG. 1A, may have the same stacked layer structure as the fuse link 150 shown in FIG. 1B.

Meanwhile, the first and second conductive regions 300a and 300b may include first and second doped regions 300a' and 300b', which are disposed in the substrate 1 at both sides of the fuse link 150 and are densely doped with conductive impurities. Also, the first and second conductive regions 300a and 300b may further include first and second contact layer regions 300a" and 300b", which are formed on the top surfaces of the first and second doped regions 300a' and 300b'. The first and second contact layer regions 300a" and 300b" may be regions for lowering contact resistance. The first and second contact layer regions 300a" and 300b" may be a silicide region, for example, but the material forming the first and second contact layer regions 300a" and 300b" may vary. The formation of the first and second contact layer regions 300a" and 300b" may be optional.

Although not shown in FIGS. 1A and 1B, the cathode 100 and the anode 200 may be coupled to a sense circuit and a programming transistor. Since the sense circuit and the programming transistor are well known to those of ordinary skill in the art, further descriptions thereof will not be provided.

Figure 2A:
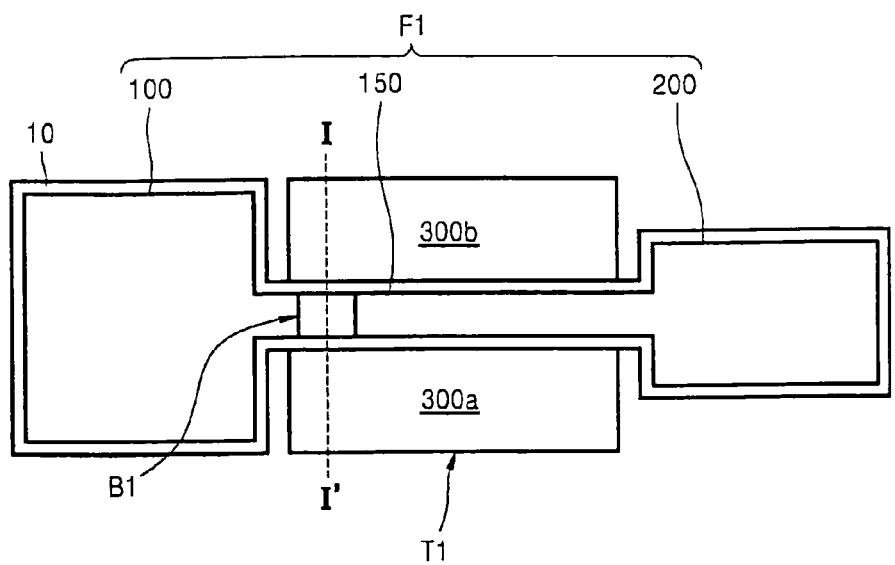
FIG. 2A is a plan view of the fuse device of FIG. 1A after the fuse device may be programmed.
Figure 2B:
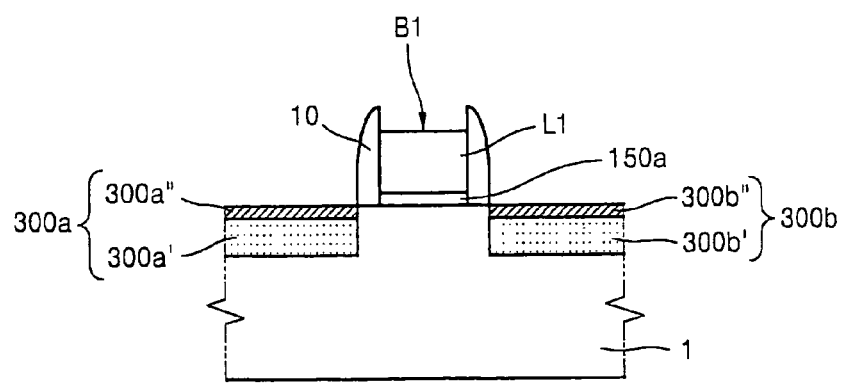
FIG. 2B is a cross-sectional view obtained along a line I-I' of FIG. 2A.

The fuse device shown in FIG. 1A may be changed as shown in FIG. 2A by a programming operation. In other words, FIG. 1A shows the fuse device before the fuse device may be programmed, and FIG. 2A shows the fuse device after the fuse device may be programmed. FIG. 2B is a cross-sectional view of the fuse device obtained along a line I-I' of FIG. 2A.

Referring to FIGS. 2A and 2B, electrons may move from the cathode 100 to the anode 200 due to a programming current applied from the anode 200 to the cathode 100. The electrons cause an electromigration effect and a Joule heating effect in the upper layer L2 (FIG. 1B) of the fuse link 150, and thus a certain region of the upper layer L2 may be blown. In FIGS. 2A and 2B, a reference character B1 may indicate the blown region. Accordingly, as the fuse link 150 is blown, a drain current of the transistor T1 may change. The drain current can be measured by applying a voltage between the first and second conductive regions 300a and 300b (that is, applying a source voltage Vs to one of the first and second conductive regions 300a and 300b, and applying a drain voltage Vd to the other), and supplying a gate voltage Vg to the fuse link 150 via either the cathode 100 or the anode 200. The drain current of the transistor T1 when the fuse link 150 is not blown and the drain current of the transistor T1 when the fuse link 150 is blown may be different. Thus, the difference between the drain currents can be measured easily. More specifically, a valid gate voltage may decrease when the fuse link 150 is blown as compared to when the fuse link 150 is not blown, and thus, generating a channel in the substrate 1 between the first and second conductive regions 300a and 300b becomes difficult. As a result, the drain current may decrease significantly.

Although a conventional fuse device may use a change in the electrical resistance of the fuse itself caused by blowing the fuse, fuse devices according to example embodiments may use a change in the drain current of the transistor T1 in which portion of the fuse unit F1 is used as an element of the transistor T1. A changing margin of the drain current is far larger than a changing margin of the current due to the change in electrical resistance of the conventional fuse unit, and thus a large sensing margin can be obtained according to example embodiments. As the sensing margin becomes larger, configuration of a sense circuit (not shown) coupled to the transistor T1 and/or the fuse unit F1 can become simpler. As a result, the size of a unitary fuse device can be reduced.

Figure 3A:
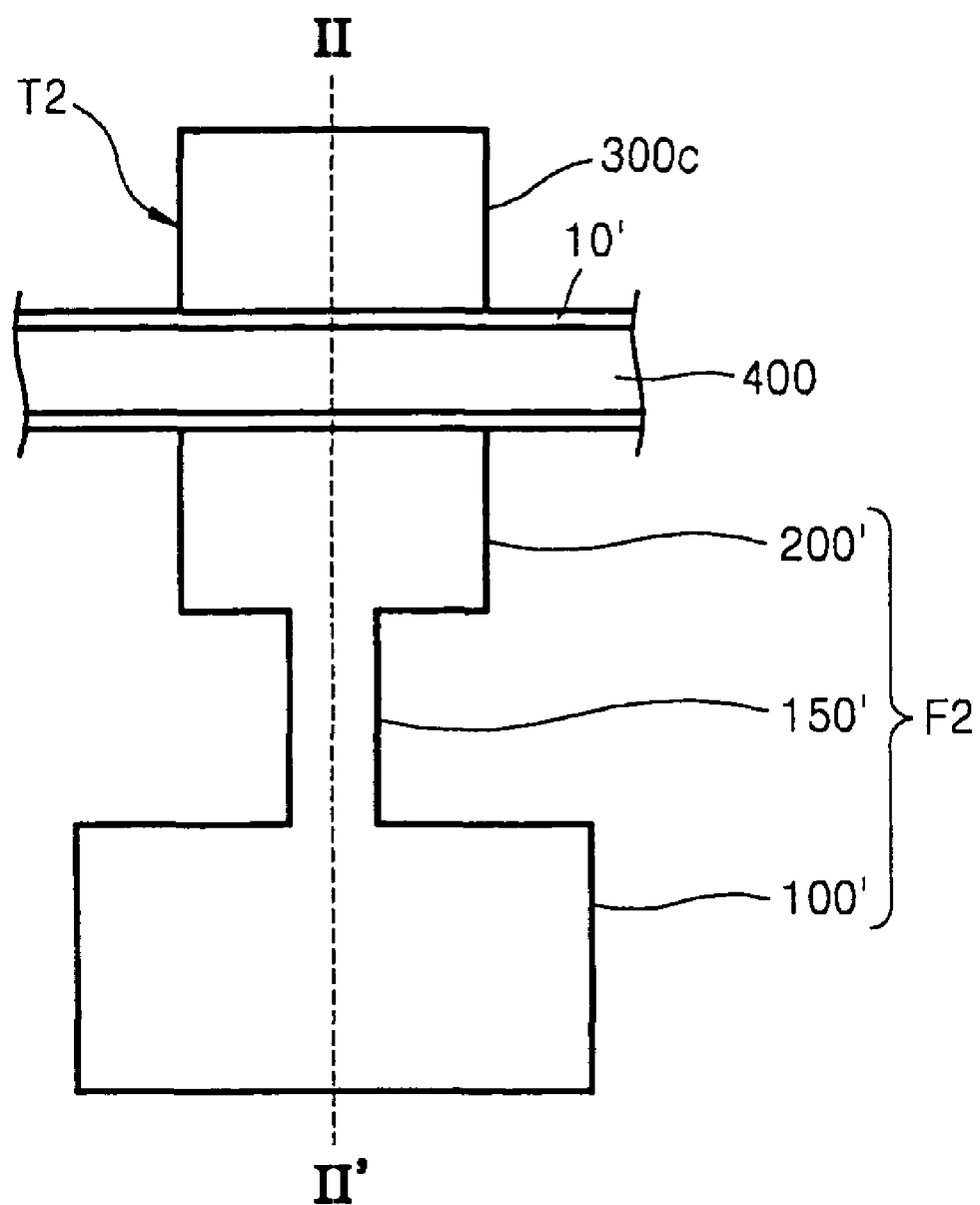
FIG. 3A is a plan view of a fuse device according to another example embodiment before the fuse device may be programmed.
Figure 3B:
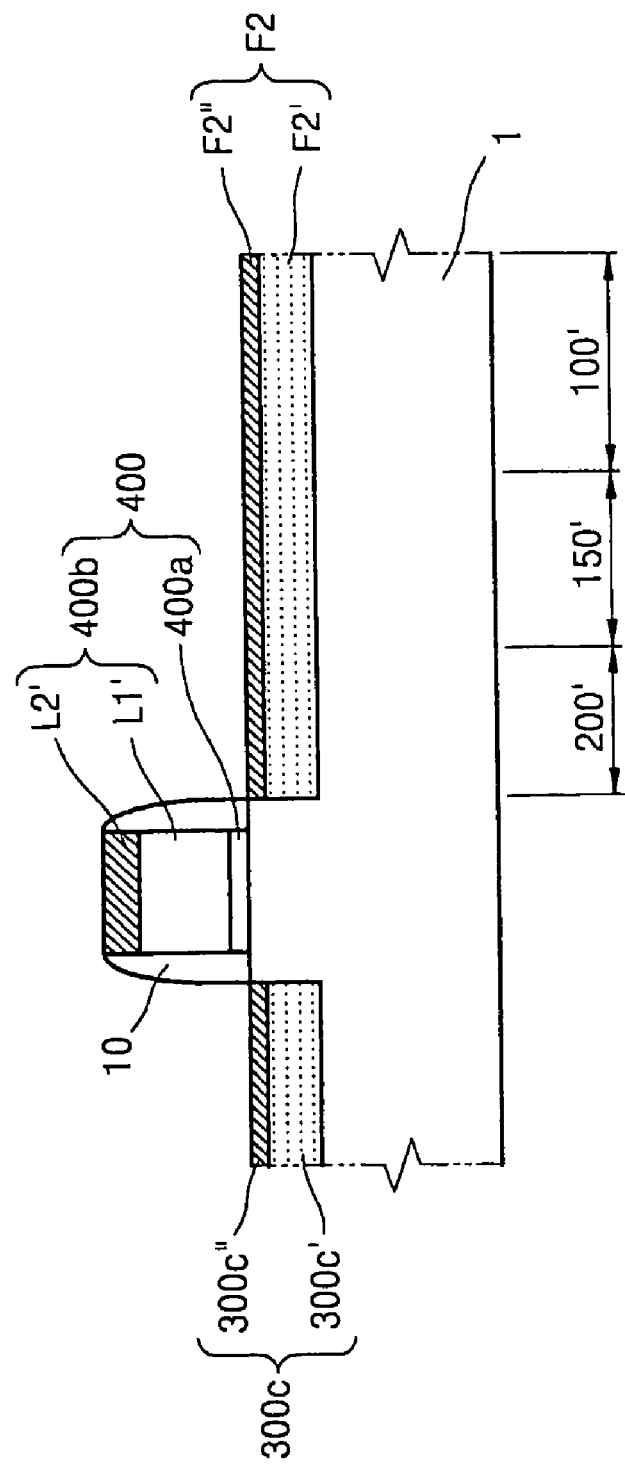
FIG. 3B is a cross-sectional view obtained along a line II-II' of FIG. 3A.

FIG. 3A is a plan view of a fuse device according to another example embodiment before the fuse device may be programmed, and FIG. 3B is a cross-sectional view of the fuse device obtained along a line II-II' of FIG. 3A.

Referring to FIG. 3A, the fuse device may include a fuse unit F2 having a planar structure similar to that of the fuse unit F1 shown in FIG. 1A. The fuse unit F2 may include a cathode 100' and an anode 200' located apart from each other and a fuse link 150' coupling the cathode 100' and the anode 200'. The fuse device may include a third conductive region 300c, located apart from the fuse unit F2, and a gate 400 between the fuse unit F2 and the third conductive region 300c. In the fuse unit F2, the anode 200' may be close to the gate 400, and the cathode 100' may be apart from the gate 400. The fuse device may further include a sidewall insulation layer 10' on sidewalls of the gate 400. One of the fuse unit F2 and the third conductive region 300c may be a source, and the other may be a drain. Therefore, the fuse unit F2, the third conductive region 300c, and the gate 400 may form a transistor T2.

Referring to FIG. 3B, the gate 400 may have a structure similar to that of the fuse link 150 shown in FIG. 1B. The gate may include an insulation layer 400a and a conductive layer 400b, which are formed on a substrate 1 in sequence, and the conductive layer 400b may have a multi-layer structure. For example, the conductive layer 400b may have a stacked layer structure in which a lower layer L1' and an upper layer L2' are stacked, wherein the lower layer L1' and the upper layer L2' may be a poly-silicon layer and a silicide layer, respectively. However, the structure and material of the conductive layer 400b may vary. For example, the conductive layer 400b may have either a single metal layer structure or a multi-metal layer structure. If the conductive layer 400b has a bi-metal layer structure, the lower layer L1' may be formed of one of Ti, TiN, and TaN, for example, and the upper layer L2' may be formed of one of W, Al, and Cu, for example. The list is not exhaustive.

The third conductive layer 300c may include a third doped region 300c' disposed in the substrate 1, and may further include a third contact layer region 300c" on the top surface of the third doped region 300c'. The third contact layer region 300c" may be a silicide region, for example. The fuse unit F2 may have a stacked layer structure similar to that of the third conductive region 300c. The fuse unit F2 may include a fourth doped region F2', which is disposed in the substrate 1, and a fourth contact layer region F2", which is disposed on the top surface of the fourth doped region F2'. Electrical resistance of the fourth contact layer region F2" may be lower than that of the fourth doped region F2'. Although the fourth contact layer region F2" may be a silicide region, the material forming the fourth contact layer region F2" may vary.

Figure 4A:
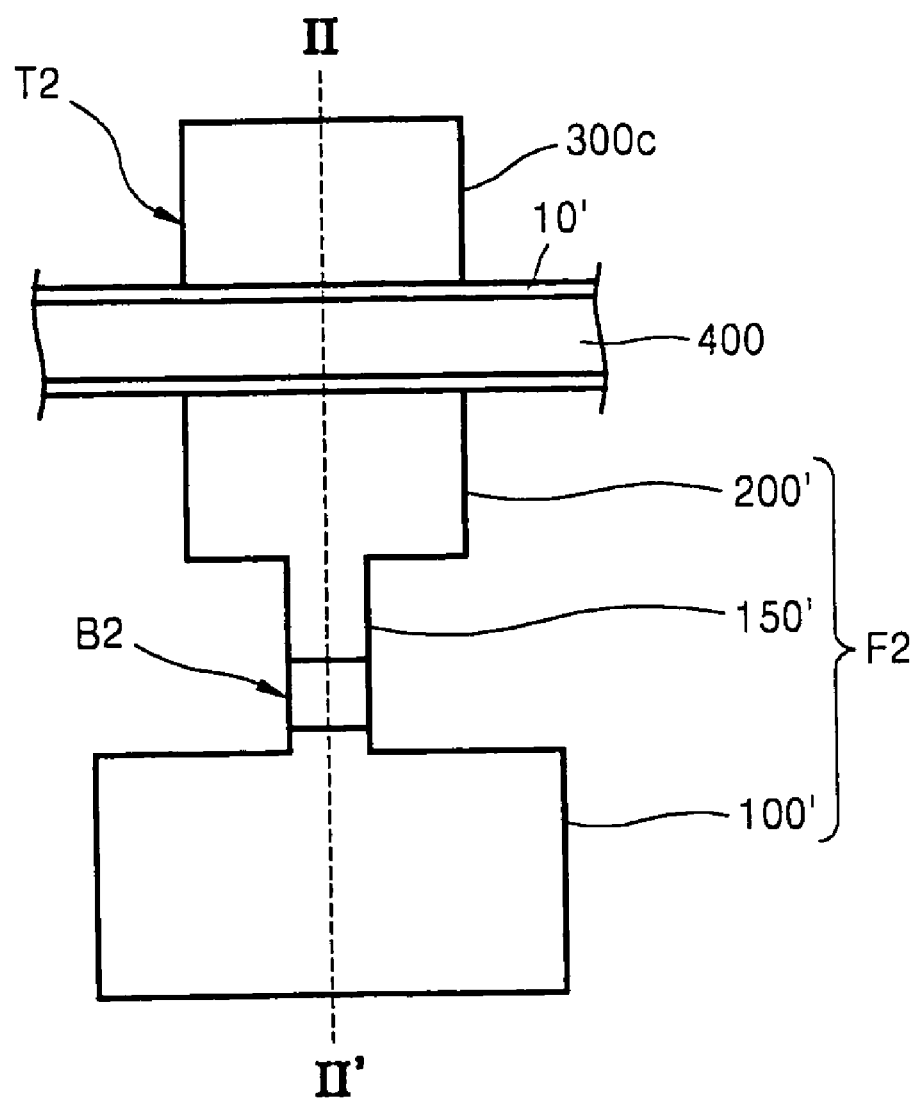
FIG. 4A is a plan view of the fuse device of FIG. 3A after the fuse device may be programmed.
Figure 4B:
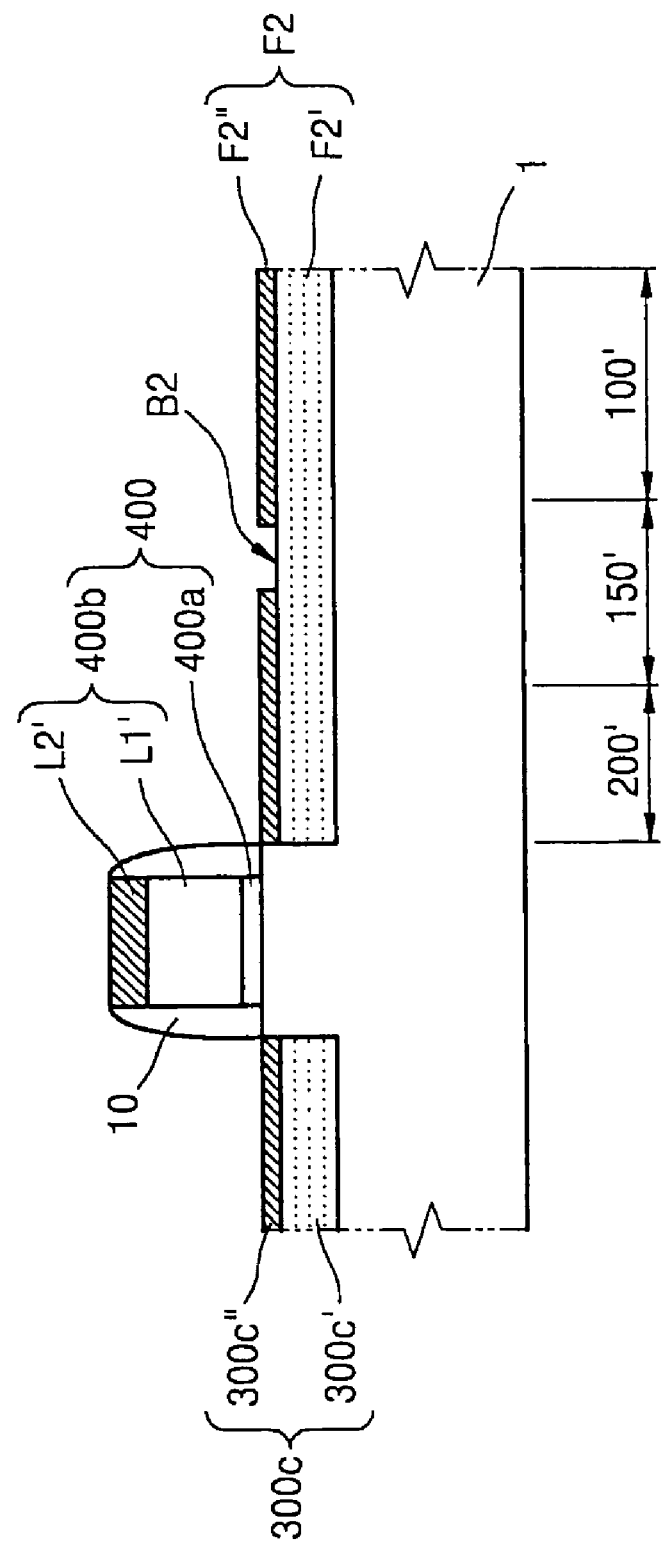
FIG. 4B is a cross-sectional view obtained along a line II-II' of FIG. 4A.

The fuse device shown in FIG. 3A may be changed as shown in FIG. 4A by a programming operation. In other words, FIG. 3A shows the fuse device before the fuse device may be programmed, and FIG. 4A shows the fuse device after the fuse device may be programmed. FIG. 4B is a cross-sectional view of the fuse device obtained along a line II-II' of FIG. 4A.

As shown in FIG. 4A, the fourth contact layer region F2" in the fuse link 150' may be blown due to a programming current applied from the anode 200' to the cathode 100'. In FIGS. 4A and 4B, a reference character B2 may refer to the blown region. Accordingly, as a portion of the fuse link 150' is blown, a drain current of the transistor T2 may change. The drain current can be measured by supplying a source voltage Vs to one of the fuse unit F2 and the third conductive region 300c, supplying a drain voltage Vd to the other, and supplying a gate voltage Vg to the gate 400. The source voltage Vs or the drain voltage Vd may be applied to the cathode 100' or the anode 200' of the fuse unit F2. The drain current of the transistor T2 when the fuse link 150' is not blown and the drain current when the fuse link 150' is partially blown may be different, and thus the difference between the drain currents can be measured easily. To be more specific, when the fuse link 150' is partially blown as shown in FIG. 4A, it may be difficult to generate a channel between the fuse unit F2 and the third conductive region 300c, and thus drain current may decrease significantly. When the fuse unit F2 is used as a source, a change in the drain current due to the blowing of the fuse link 150' may be very significant. In other words, when the fuse unit F2 is used as a source, a source resistance may change as the fuse link 150' is blown. The change of the source resistance may induce changes in gate voltage, drain voltage, and body bias. As a result, the change in the source resistance may cause a significant change in the drain current. A principle regarding changes in gate voltage, drain voltage, and body bias due to a change in the source resistance of a conventional transistor is described in "Fundamentals of Modern VLSI devices" (Taur and Ning).

Figure 5:
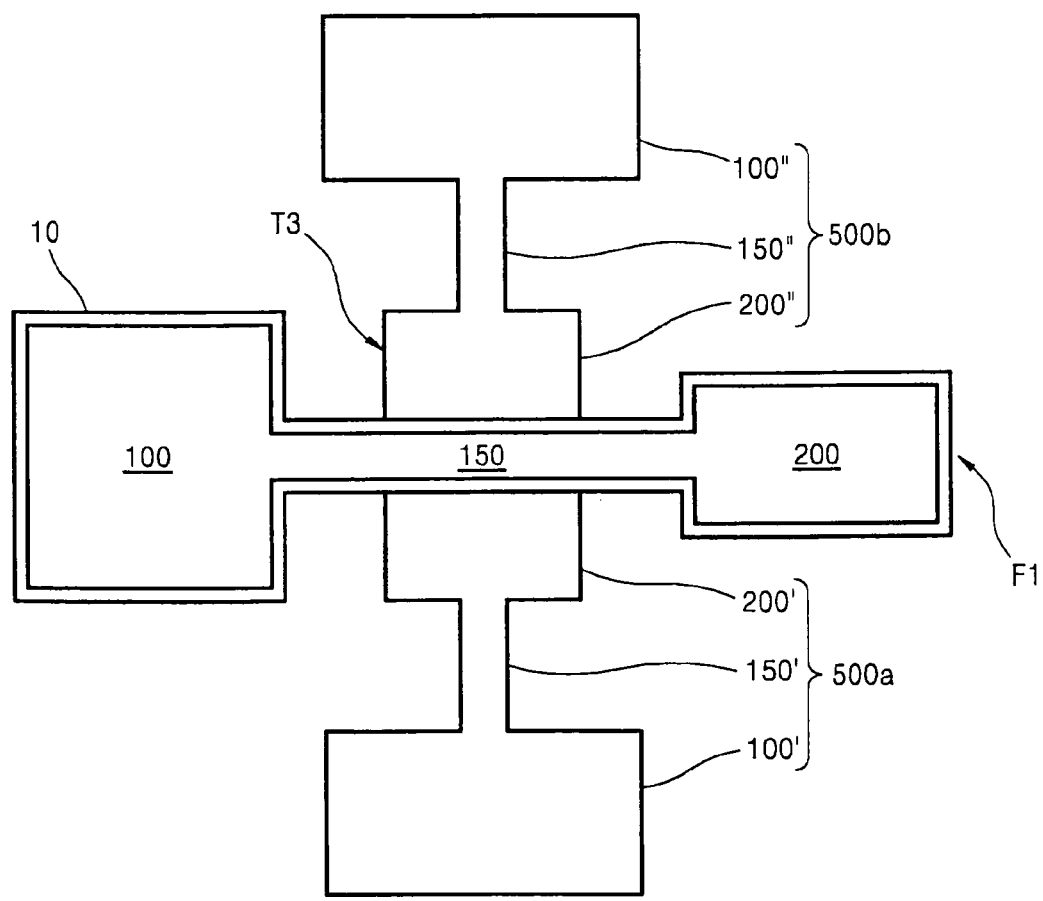
FIG. 5 is a plan view of a fuse device according to another example embodiment before the fuse device may be programmed.

At least one of the first and second conductive regions 300a and 300b shown in FIG. 1A may be modified to have a structure similar to that of the fuse unit F2 shown in FIG. 3A. An embodiment in which the first and second conductive regions 300a and 300b in FIG. 1A may be modified to have the structure similar to the structure of the fuse unit F2 shown in FIG. 3A is shown in FIG. 5. Hereinafter, in the description of FIG. 5, the cathode 100, the fuse link 150, and the anode 200 will be referred as a first cathode 100, a first fuse link 150, and a first anode 200, respectively. Furthermore, the cathode 100', the fuse link 150', and the anode 200' will be referred to as a second cathode 100', a second fuse link 150', and a second anode 200'.

Referring to FIG. 5, fourth and fifth conductive regions 500a and 500b are disposed at each of the two sides of the first fuse link 150. The fourth and fifth conductive regions 500a and 500b may have fuse structures. The fourth conductive region 500a may include the second cathode 100' and the second anode 200' located apart from each other and the second fuse link 150' disposed between the second cathode 100' and the second anode 200'. Similarly, the fifth conductive region 500b may include a third cathode 100" and a third anode 200" located apart from each other and a third fuse link 150" disposed therebetween. The fourth and fifth conductive regions 500a and 500b may be symmetrical with respect to the lengthwise direction of first fuse link 150. However, it should be understood that the shapes of the fourth and fifth conductive regions 500a and 500b may vary and, therefore, do not need to be symmetrical. One of the fourth and fifth conductive regions 500a and 500b may be a source, the other may be a drain, and the first fuse link 150 between the fourth and fifth conductive regions 500a and 500b may be a gate. Therefore, the fourth and fifth conductive regions 500a and 500b and the first fuse link 150 may form a transistor T3.

Figure 6:
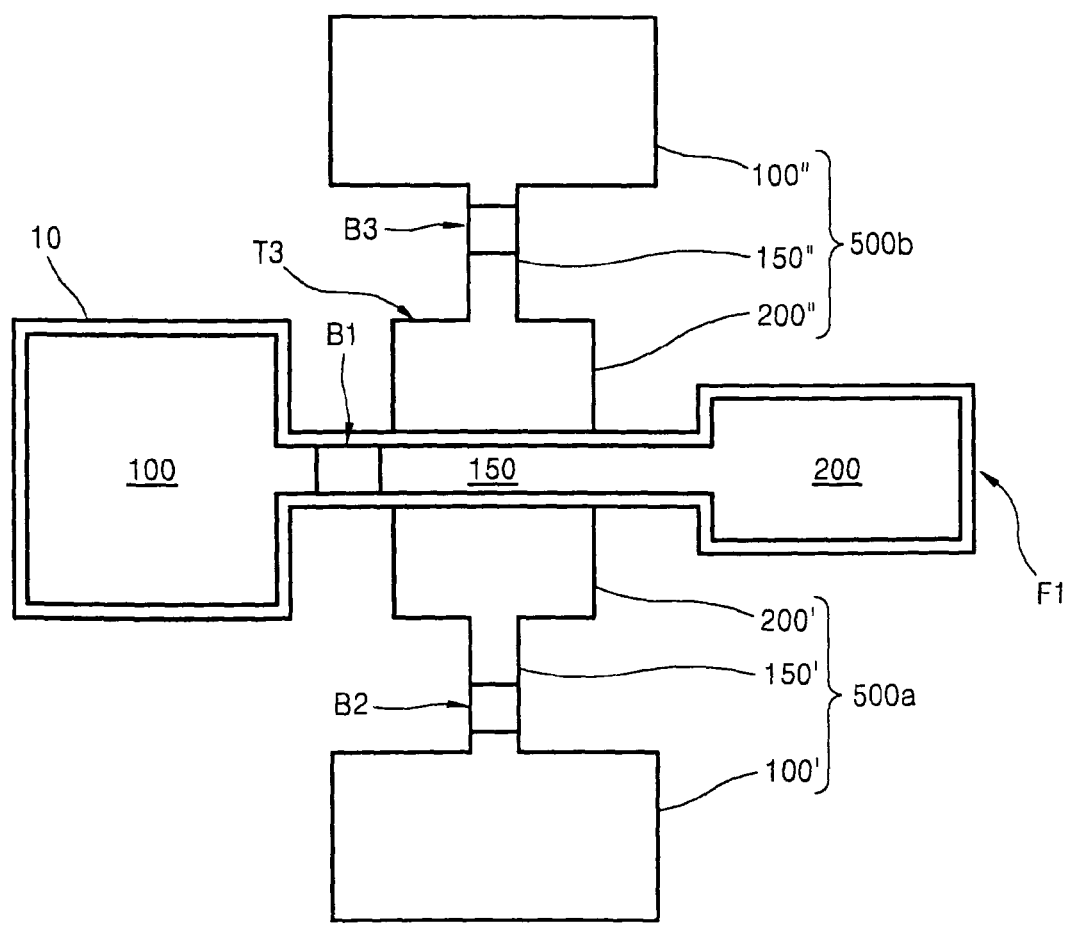
FIG. 6 is a plan view of the fuse device of FIG. 5 after the fuse device may be programmed.

In the structure shown in FIG. 5, a drain current of the transistor T3 changes as one or more of the first through third fuse links 150, 150', and 150" may be blown by the programming current. FIG. 6 shows a fuse device in which all of the first through third fuse links 150, 150', and 150" may be blown. In FIG. 6, reference characters B1 through B3 may indicate blown regions. If two or all of the first through third fuse links 150, 150', and 150" are blown, a change in the drain current may be more significant compared to the fuse devices shown in FIG. 1A or FIG. 3A.

According to at least one other example embodiment, a programming method other than blowing can be used. More specifically, highly-resistant regions having a relatively high electrical resistance may be disposed in regions of the fuse links 150, 150', and 150". Therefore, the fuse devices may be programmed by changing positions of the highly-resistant regions.

Figure 7A:
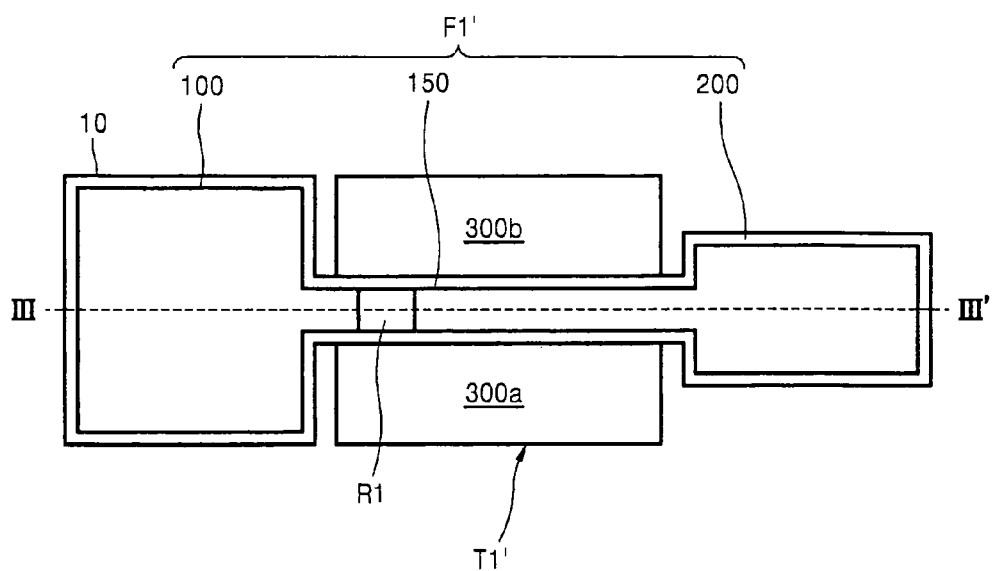
FIG. 7A is a plan view of a fuse device according to another example embodiment before the fuse device may be programmed.
Figure 7B:
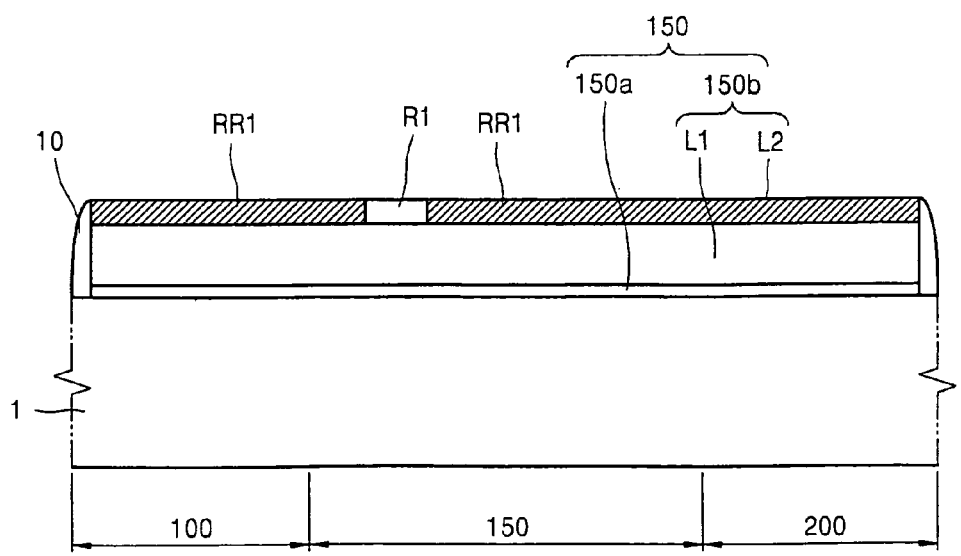
FIG. 7B is a cross-sectional view obtained along a line III-III' of FIG. 7A.
Figure 8A:
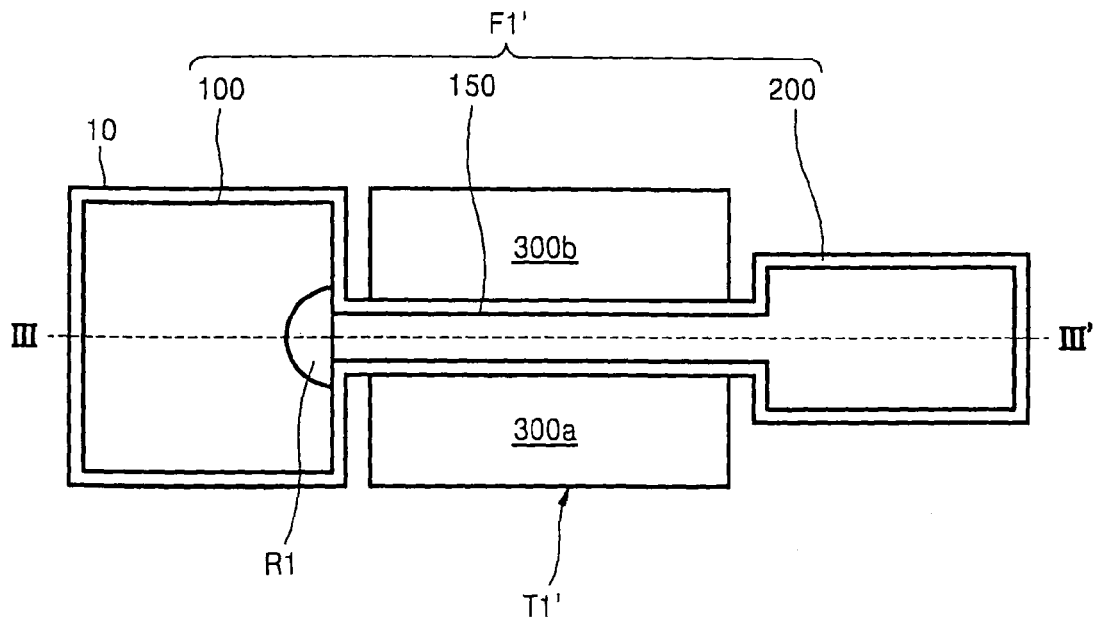
FIG. 8A is a plan view of the fuse device of FIG. 7A after the fuse device may be programmed.
Figure 8B:
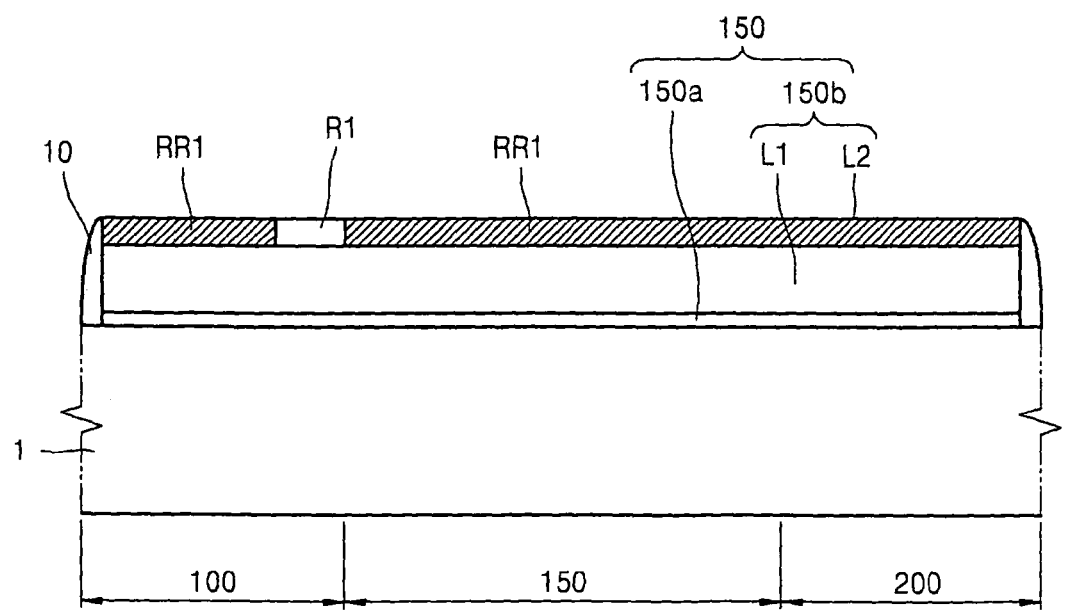
FIG. 8B is a cross-sectional view obtained along a line III-III' of FIG. 8A.
Figure 9A:
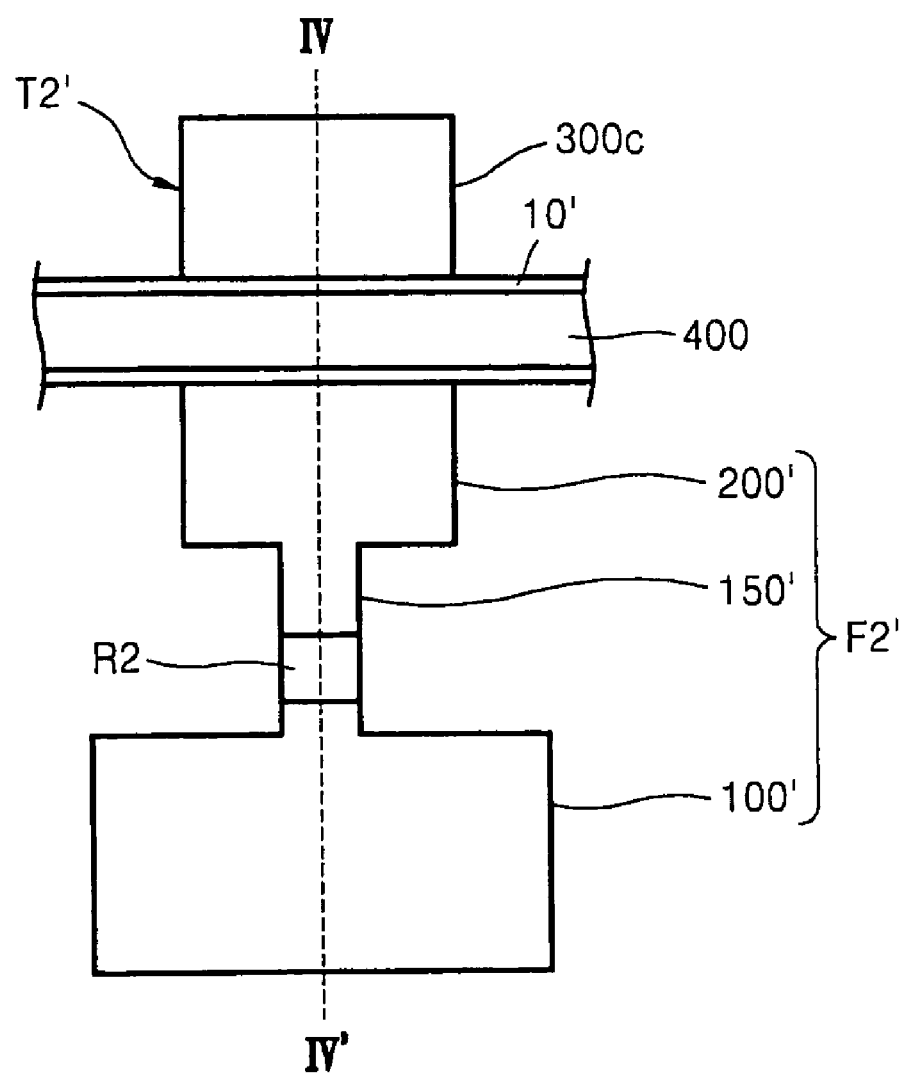
FIG. 9A is a plan view of a fuse device according to another example embodiment before the fuse device may be programmed.
Figure 9B:
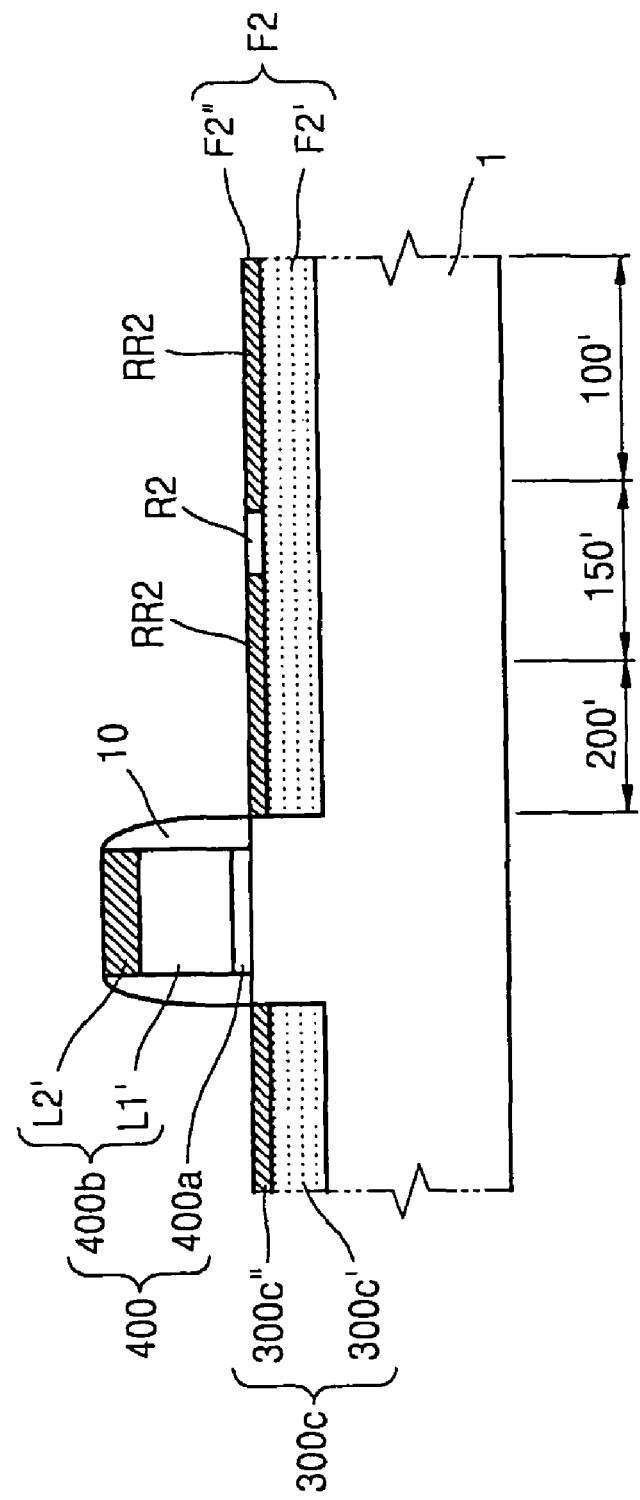
FIG. 9B is a cross-sectional view obtained along a line IV-IV' of FIG. 9A.
Figure 10A:
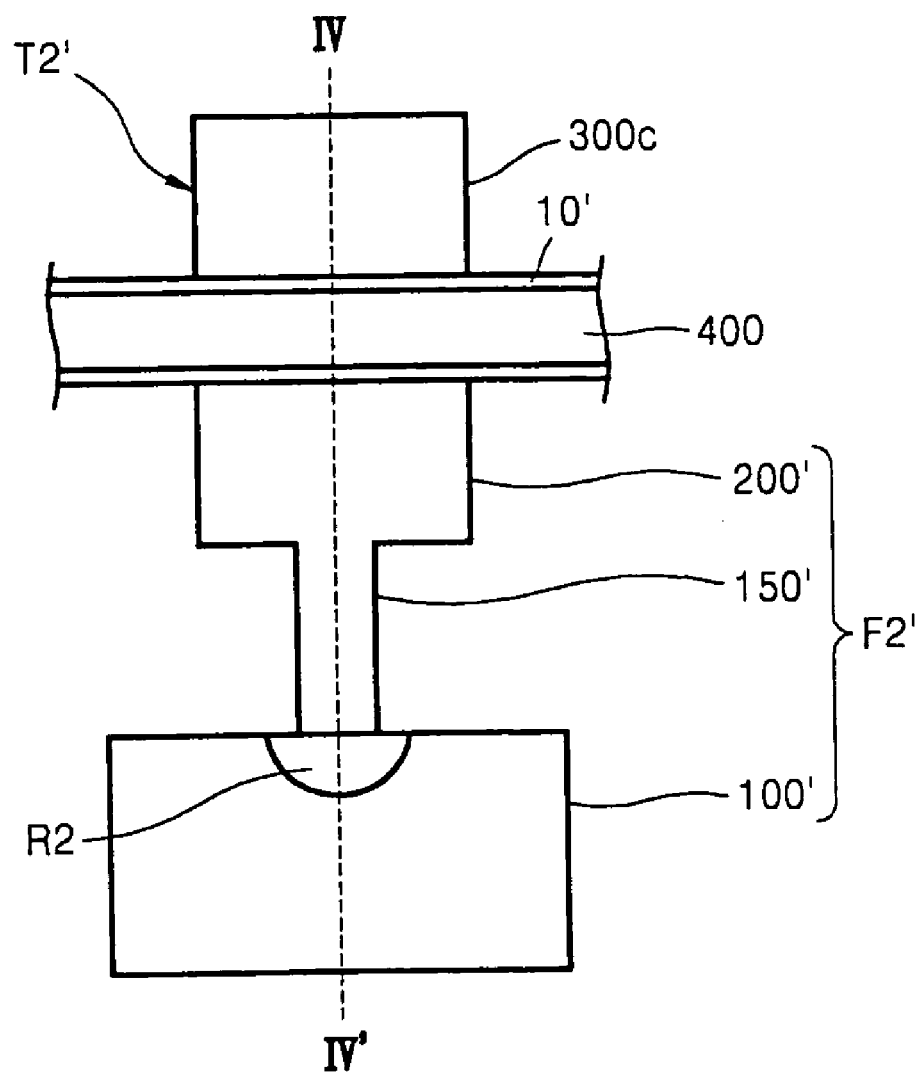
FIG. 10A is a plan view of the fuse device of FIG. 9A after the fuse device may be programmed.
Figure 10B:
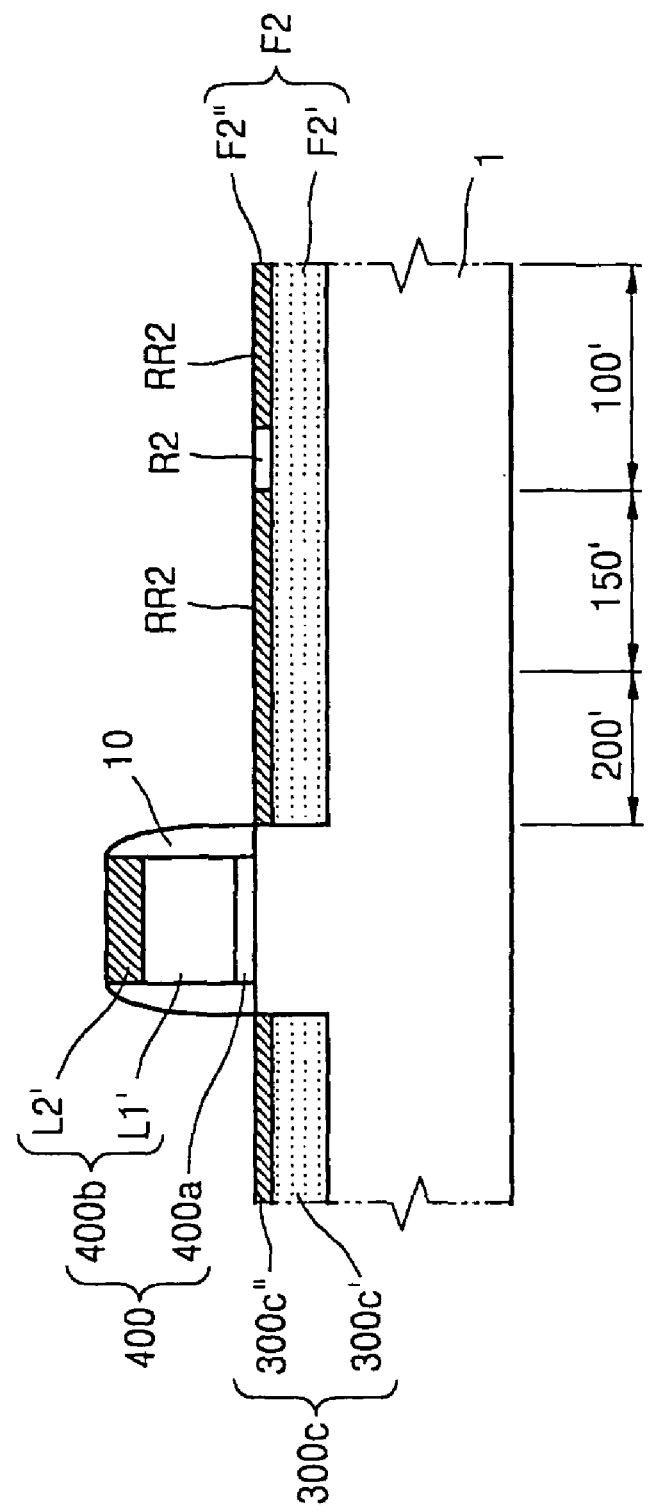
FIG. 10B is a cross-sectional view obtained along a line IV-IV' of FIG. 10A.
Figure 11:
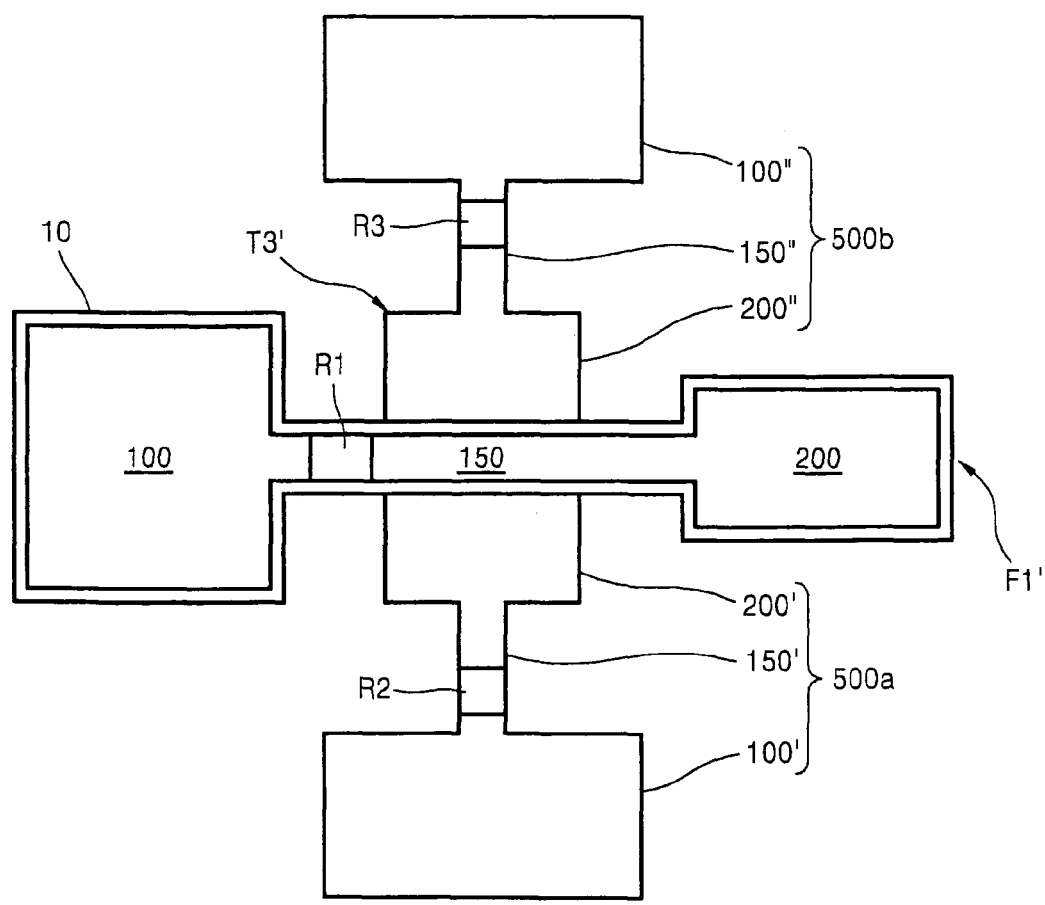
FIG. 11 is a plan view of a fuse device according to another example embodiment before the fuse device may be programmed.
Figure 12:
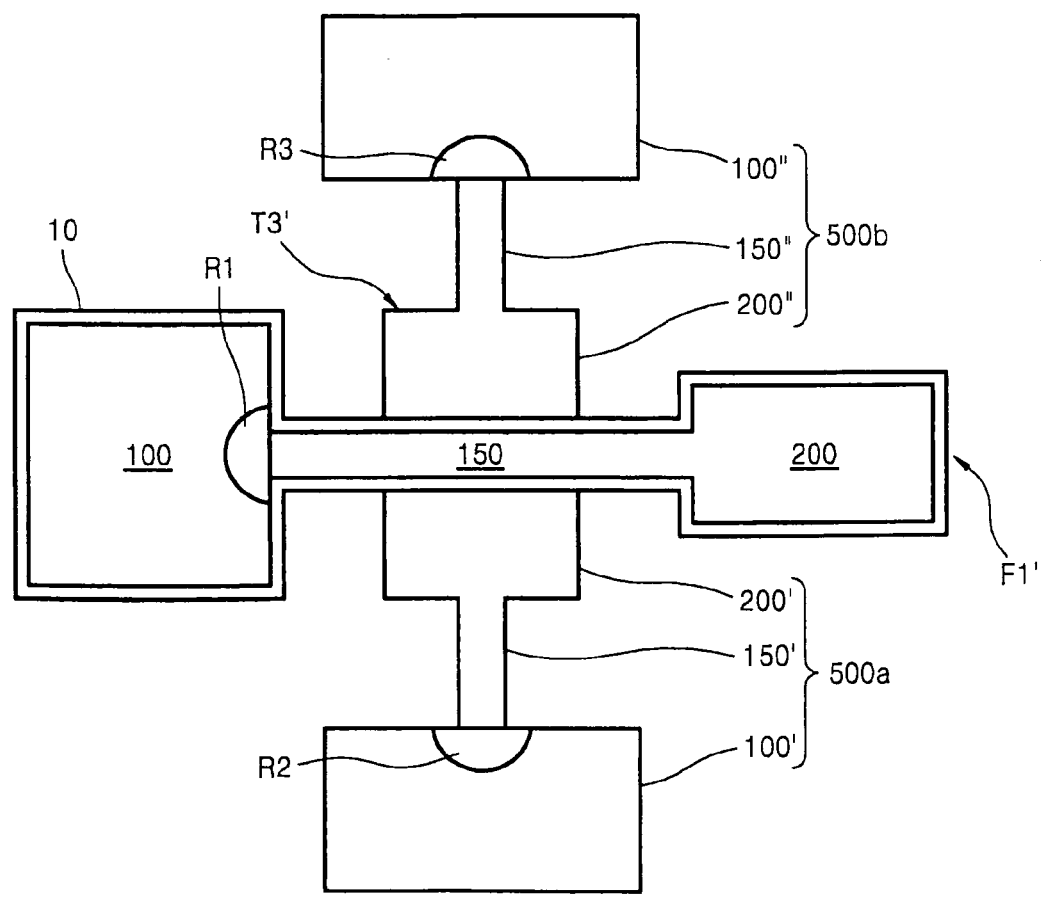
FIG. 12 is a plan view of the fuse device of FIG. 11 after the fuse device may be programmed.

FIGS. 7A, 9A, and 11 are plan views of fuse devices according to other example embodiments, wherein the fuse devices may be similar to the fuse devices shown in FIGS. 1A, 3A, and 5, respectively, except that the fuse links 150, 150', and 150" may include highly-resistant regions R1, R2, and R3, respectively. FIGS. 7B and 9B are cross-sectional views obtained along lines III-III' of FIG. 7A and of FIG. 9A, respectively. FIGS. 7A, 7B, 9A, 9B, and 11 show example embodiments of fuse devices before the fuse devices may be programmed, and FIGS. 8A, 8B, 10A, 10B, and 12 show the fuse devices after the fuse devices may be programmed.

Referring to FIGS. 7A and 7B, the upper layer L2 of the fuse link 150 may include the highly-resistant region R1 and a remaining region RR1. The highly-resistant region R1 may have an electrical resistance higher than the remaining region RR1 of the upper layer L2. For example, the highly-resistant region R1 may be a poly-silicon region, and the remaining region RR1 of the upper layer L2 may be silicide regions. The lower layer L1 may be a poly-silicon layer and thus, the highly-resistant region R1 and the lower layer L1 may be formed of the same material. However, example embodiments are not limited thereto. If the conductive layer 150b of the fuse link 150 has either a single metal layer structure or a multi metal layer structure, the highly-resistant region R1 may be formed by partially doping nitrogen, oxygen, or resistive metal ions into the metal layer structure. The highly-resistant region R1 may be closer to the cathode 100 than to the anode 200, so that the highly-resistant region R1 may be moved to the cathode 100 easily. In FIG. 7A, a reference character F1' may indicate a fuse unit, and a reference character T1' may indicate a transistor.

The highly-resistant region R1 may be moved into the cathode 100 by applying a programming current to the fuse device shown in FIGS. 7A and 7B. The highly-resistant region R1 may be moved due to a general electromigration (EM) effect. FIGS. 8A and 8B show a case in which the highly-resistant region R1 may be moved into the cathode 100. When the highly-resistant region R1 is moved from the fuse link 150 into the cathode 100, the electrical resistance of the fuse unit F1' may change. In other words, the electrical resistance of the fuse unit F1' may be lower when the highly-resistant region R1 is located in the cathode 100 compared to when the highly-resistant region R1 is located in the fuse link 150. The width of the cathode 100 may be greater than that of the fuse link 150. Accordingly, the electrical resistance of the fuse unit F1' may change according to the movement of the highly-resistant region R1. As a result, the drain current of the transistor T1' may change. A method of measuring the drain current may be similar to the method described in reference to FIG. 2A.

Referring to FIGS. 9A and 9B, the fourth contact layer region F2" of the second fuse link 150' may include the highly-resistant region R2. The highly-resistant region R2 may have an electrical resistance higher than remaining regions RR2 of the fourth contact layer region F2". For example, the highly-resistant region R2 may be a poly-silicon region and the remaining region RR2 of the fourth contact layer region F2" may be a silicide region. However, the example embodiments are not limited thereto, and the structure and material of the second fuse link 150' may vary. If the second fuse link 150' has either a single metal layer structure or a multi-metal layer structure, the highly-resistant region R2 may be formed by partially doping nitrogen, oxygen, or resistive metal ions into the metal layer structure. The highly-resistant region R2 may be closer to the second cathode 100' than to the second anode 200'. In FIG. 9A, a reference character F2' may indicate a fuse unit, and a reference number T2' may indicate a transistor.

The highly-resistant region R2 may be moved into the second cathode 100' by applying a programming current to the fuse device shown in FIGS. 9A and 9B. FIGS. 10A and 10B show the fuse device after the fuse device may be programmed. When the highly-resistant region R2 is moved from the second fuse link 150' into the second cathode 100', the electrical resistance of the fuse unit F2' and the drain current of the transistor T2' may change. When the drain current is being measured, one of the fuse unit F2' and the third doped region 300c may be used as a source, and the other may be used as a drain. A method of measuring the drain current may be similar to the method described in reference to FIG. 4A.

Referring to FIG. 11, the first through third fuse links 150, 150', and 150" may include the highly-resistant regions R1, R2, and R3, respectively. At least one of the highly-resistant regions R1 through R3 may be moved into the first through third cathodes 100, 100', and 100", respectively. A possible result of moving the first through third highly-resistant regions R1 through R3 into the first through third cathodes 100, 100', and 100", respectively, may be shown in FIG. 12.

The fuse devices according to example embodiments may be arranged in a two-dimensional array structure, and may be applied to semiconductor memory devices, logic devices, microprocessors, field programmable gate arrays, one time programmable (OTP) devices, and other very large scale integration (VLSI) circuits for various purposes.

Additionally, methods of manufacturing a fuse device according to example embodiments are briefly described below.

Figure 13A:
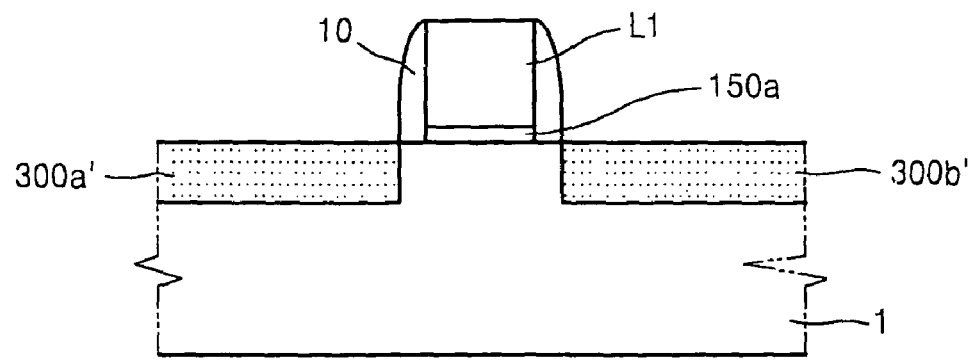
FIGS. 13A through 13C are cross-sectional views showing a method of manufacturing a fuse device, according to an example embodiment.
Figure 13B:
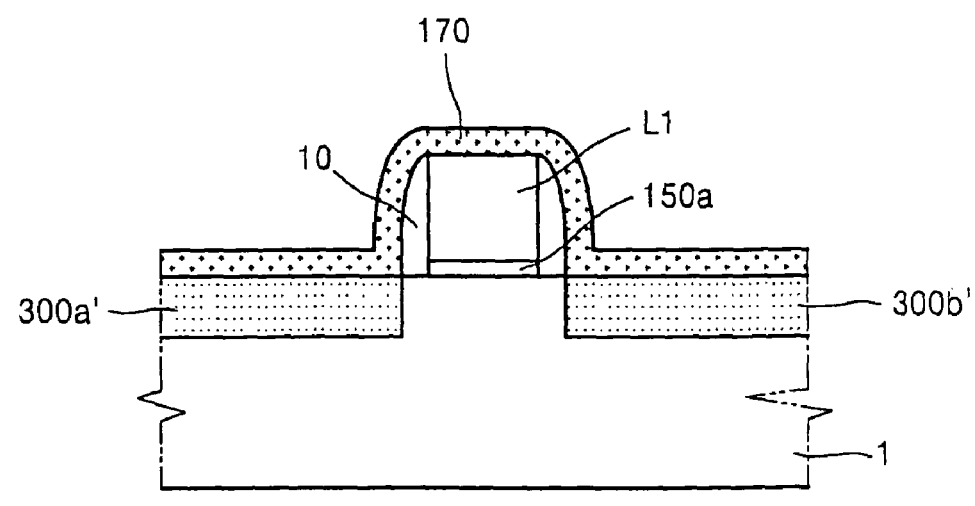
Figure 13C:
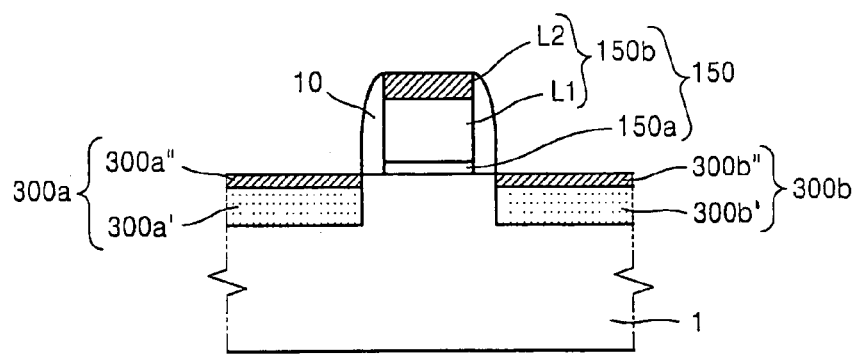

FIGS. 13A through 13C show a method of manufacturing a fuse device according to an example embodiment. The example embodiment may be a method of manufacturing the fuse device of FIG. 1B.

Referring to FIG. 13A, after forming a stacked layer pattern, in which an insulation layer 150a and a lower layer L1 may be stacked in sequence on a substrate 1, a sidewall insulation layer 10 may be formed on sidewalls of the insulation layer 150a and the lower layer L1. The sidewall insulation layer 10 may be formed by using an anisotropic etching method. After the sidewall insulation layer 10 is formed, first and second doped regions 300a' and 300b' may be formed by doping conductive impurities into the substrate 1 at both sides of the insulation layer 150a and the lower layer L1.

Referring to FIG. 13B, a metal layer 170 may be formed over the substrate 1 to cover the lower layer L1, the sidewall insulation layer 10, and the first and second doped regions 300a' and 300b'. The substrate 1 may then be annealed so that a silicide reaction occurs between the metal layer 170 and the lower layer L1 and between the metal layer 170 and first and second doped regions 300a' and 300b'. A portion of the metal layer 170 which does not react may be removed thereafter, as shown in FIG. 13C. FIG. 13C shows a structure similar to that shown in FIG. 1B. In FIG. 13C, the upper layer L2 may be a result of a reaction between the metal layer 170 and the lower layer L1, and the first and second contact layer regions 300a" and 300b" may be a result of the reaction between the metal layer 170 and the first and second doped regions 300a' and 300b'.

The structure shown in FIG. 3B, which is similar to that shown in FIG. 1B, may be manufactured by using a method similar to that described in reference to FIGS. 13A through 13C, and the structure shown in FIG. 5 may also be manufactured by using the method described in reference to FIGS. 13A through 13C.

Figure 14A:
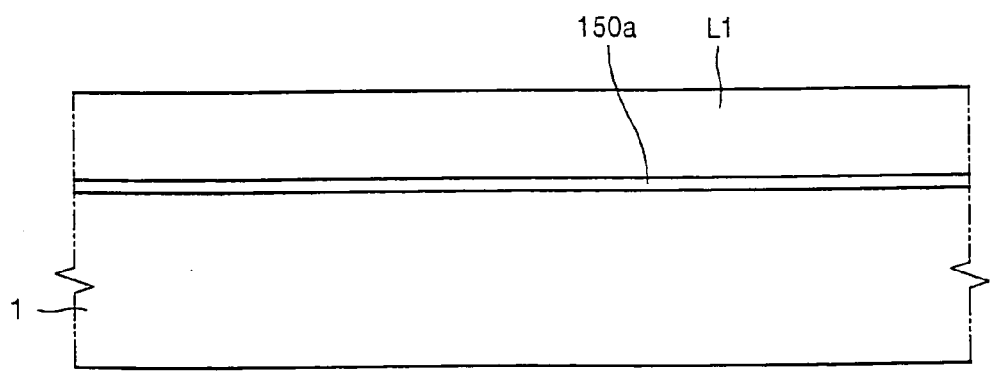
FIGS. 14A through 14C are cross-sectional views showing a method of manufacturing a fuse device, according to another example embodiment.
Figure 14B:
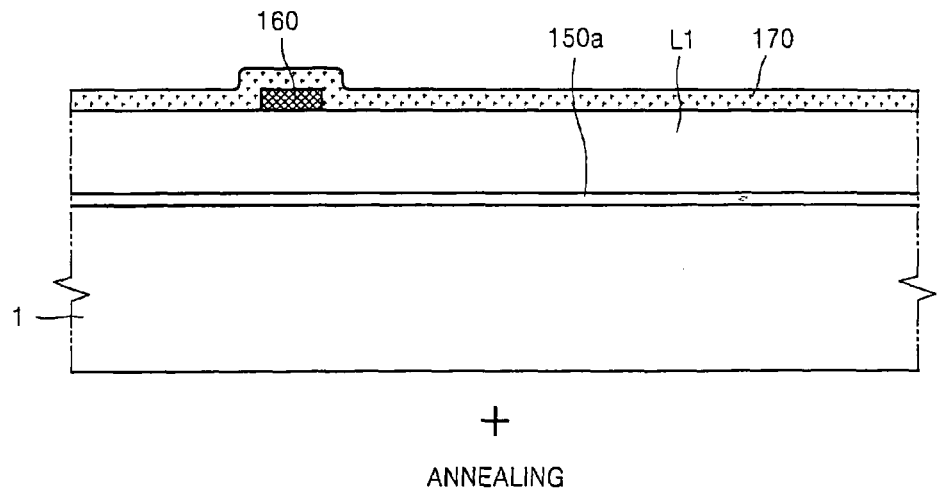
Figure 14C:
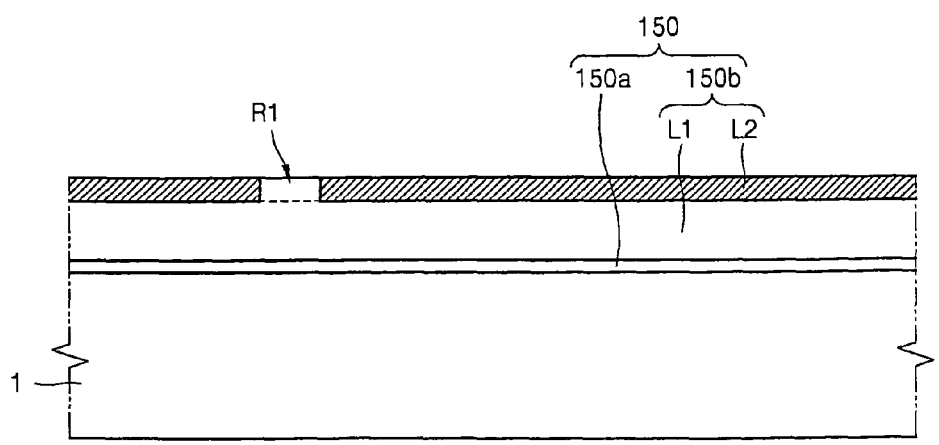

FIGS. 14A through 14C show a method of manufacturing a fuse device according to another example embodiment. The method illustrated in FIGS. 14A through 14C may be used to manufacture the fuse device shown in FIG. 7B.

Referring to FIG. 14A, the insulation layer 150a and the lower layer L1 may be formed on the substrate 1 in sequence.

Referring to FIG. 14B, a mask layer 160 may be formed on a pre-determined region of the lower layer L1. The mask layer 160 may be an insulation layer such as a silicon-nitride layer or a silicon-oxide layer, but is not limited thereto. A metal layer 170 may be formed on the lower layer L1 to cover the mask layer 160. The substrate 1 may be annealed so that a silicide reaction occurs between the lower layer L1 and the metal layer 170. Thereafter, a portion of metal layers 170 which did not react and the mask layer 160 may be removed, as shown in FIG. 14C.

In FIG. 14C, the upper layer L2 may be a result of a reaction between the lower layer L1 and the metal layer 170. While the substrate 1 is annealed, a portion of the lower layer L1 covered by the mask layer 160 (FIG. 14B) may not react with the metal layer 170, and thus the portion of the lower layer L1 may not be silicided. The portion of the lower layer L1 that is not silicided may be the highly-resistant region R1.

Accordingly, the fuse device shown in FIGS. 7A and 7B may be manufactured by using the method described in reference to FIGS. 14A through 14C. Also, the highly-resistant region R2 shown in FIGS. 9A and 9B may be formed by using a method similar to the method of forming the highly-resistant region R1 shown in FIG. 14C. The fuse device shown in FIGS. 9A and 9B may be manufactured by using a method similar to that described in reference to FIGS. 14A through 14C. Since the structure shown in FIG. 11 is similar to a combination of structures shown in FIGS. 7A and 9A, the structure shown in FIG. 11 may also be formed by using a method similar to that described in reference to FIGS. 14A through 14C.

Meanwhile, when the conductive layer 150b shown in FIG. 7B has either a single metal layer structure or a multi metal layer structure, a highly-resistant region may be formed by partially doping nitrogen, oxygen, or resistant metal ions into the conductive layer 150b. The method may also be used when the highly-resistant regions R1 through R3 shown in FIGS. 9B and 11 are formed.

While the example embodiments have been particularly shown and described with reference to example embodiments, it will be understood by those of ordinary skill in the art that various changes in form and details of the fuse devices shown in FIGS. 1A through 12 may be made therein without departing from the spirit and scope of the example embodiments as defined by the following claims. It should be understood that various changes may be made in the shapes of the cathodes 100, 100', and 100'', the anodes 200, 200', and 200'', and the fuse links 150, 150', and 150''. Furthermore, a bulk silicon substrate, a silicon on insulator (SOI) substrate, and other types of substrates may be used as the substrate 1, for example.

What is claimed is:

1. A method of operating a fuse device including a fuse unit which includes a cathode, an anode, and a fuse link connecting the cathode and the anode, and a transistor including at least a first portion of the fuse unit, the method comprising:
    applying a programming current to the fuse unit;
    measuring a drain current of the transistor, wherein the fuse link is a gate of the transistor, the transistor further includes a source and a drain on a substrate at an each side of the fuse link, and at least one of the source and the drain has a fuse structure including,
        two regions located apart from each other, and
        a link region which has a width less than each of the two regions and the link region is located between the two regions; and
    applying another programming current to at least one of the source and the drain having the fuse structure, prior to the measuring of the drain current.

2. The method of claim 1, wherein measuring the drain current includes supplying a gate voltage to at least one of the cathode and anode, and supplying a voltage between the source and the drain.

3. The method of claim 1, wherein the transistor comprises:
    at least the first portion of the fuse unit as the source;
    the drain located apart from the source; and
    the gate on a substrate between at least the first portion of the fuse unit and the drain.

4. The method of claim 3, wherein measuring the drain current includes supplying a gate voltage to the gate, and supplying a voltage between the cathode and the drain.

5. The method of claim 3, wherein the fuse unit includes, a doped region, and
    a contact layer region, the contact layer region configured to change a drain current of the transistor.

6. The method of claim 1, wherein the transistor comprises:
    at least the first portion of the fuse unit as the drain;
    the source located apart from the drain; and
    the gate on a substrate between the source and at least the first portion of the fuse unit.

7. The method of claim 6, wherein measuring the drain current includes supplying a gate voltage to the gate, and supplying a voltage between the cathode and the source.

8. The method of claim 6, wherein the fuse unit includes, a doped region, and
    a contact layer region, the contact layer region configured to change a drain current of the transistor.

9. The method of claim 1, wherein applying the programming current includes blowing the fuse link.

10. A method of operating a fuse device including a fuse unit which includes a cathode, an anode, and a fuse link connecting the cathode and the anode, and a transistor including at least a first portion of the fuse unit, the method comprising:
    applying a programming current to the fuse unit; and
    measuring a drain current of the transistor, wherein the fuse link includes,
        a conductive layer, and
        a highly-resistant region in a portion of the conductive layer, wherein the highly-resistant region is a region having an electrical resistance higher than that of a remaining portion of the conductive layer.

11. The method of claim 1, wherein sidewalls of the fuse link are covered with an insulation layer.

12. The method of claim 11, wherein the insulation layer covers sidewalls of the fuse link, anode and cathode.

13. The method of claim 1, wherein the cathode includes,
    a highly-resistant region, wherein the highly-resistant region is a region having an electrical resistance higher than a remaining portion of the cathode.

14. The method of claim 13, wherein an electrical resistance of the fuse unit is based on the location of the highly-resistant region.

15. The method of claim 13, wherein the highly-resistant region is configured to move.

16. The method of claim 10, wherein applying the programming current includes,
    moving the highly-resistant region into the cathode.

* * * * *